(12) United States Patent
Yonekawa et al.

(10) Patent No.: US 9,213,231 B2
(45) Date of Patent: Dec. 15, 2015

(54) REFLECTIVE ORIGINAL, EXPOSURE METHOD, AND DEVICE MANUFACTURING METHOD

(71) Applicant: CANON KABUSHIKI KAISHA, Tokyo (JP)

(72) Inventors: Masami Yonekawa, Utsunomiya (JP); Akira Miyake, Nasukarasuyama (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/325,537

(22) Filed: Jul. 8, 2014

(65) Prior Publication Data

US 2015/0017573 A1 Jan. 15, 2015

(30) Foreign Application Priority Data

Jul. 10, 2013 (JP) ................................. 2013-144855

(51) Int. Cl.
*G03F 1/24* (2012.01)
*G03F 7/20* (2006.01)

(52) U.S. Cl.
CPC ................ *G03F 1/24* (2013.01); *G03F 7/2002* (2013.01)

(58) Field of Classification Search
CPC ................................. G03F 1/24; G03F 7/2002
USPC ...................................................... 430/5, 322
See application file for complete search history.

(56) References Cited

U.S. PATENT DOCUMENTS

2006/0072085 A1 4/2006 Compen et al.
2006/0270226 A1* 11/2006 Hosoya ........................ 438/686

FOREIGN PATENT DOCUMENTS

| JP | 06-177018 A | 6/1994 |
|---|---|---|
| JP | 07-153672 A | 6/1995 |
| JP | 2000-088999 A | 3/2000 |
| JP | 2002-277589 A | 9/2002 |
| JP | 2007-073949 A | 3/2007 |
| JP | 2007-109968 A | 4/2007 |

* cited by examiner

*Primary Examiner* — Caleen Sullivan
(74) *Attorney, Agent, or Firm* — Rossi, Kimms & McDowell LLP

(57) ABSTRACT

A reflective original includes: a reflection layer which has a multilayer film configured to reflect extreme ultraviolet light; a base material configured to support the reflection layer; and a thermal diffusion layer interposed between the reflection layer and the base material, and configured to diffuse heat of the reflection layer. A heat capacity, per unit area, of a structure constituted by both the reflection layer and the thermal diffusion layer is not lower than 1.1 $(J/(K \cdot m^2))$.

14 Claims, 8 Drawing Sheets

F I G. 3

| | MATERIAL | DENSITY ρ [kg/m³] | SPECIFIC HEAT c [J/(kg*k)] | THERMAL CONDUCTIVITY λ [W/(m*k)] | THERMAL DIFFUSION COEFFICIENT α [m²/s] | THERMAL DIFFUSION COEFFICIENT RATIO |
|---|---|---|---|---|---|---|
| ABSORPTION FILM | Ta | 16600 | 138 | 57 | 2.5E-5 | 29 |
| MULTILAYER FILM | Ru | 12370 | 238 | 117 | 4.0E-5 | 47 |
| | Mo | 10220 | 248 | 138 | 5.4E-5 | 63 |
| | Si | 2330 | 713 | 148 | 8.9E-5 | 103 |
| SUBSTRATE | SiO₂ LTEM | 2190 | 740 | 1.4 | 8.6E-5 | 1 |

FIG. 13

| THERMAL RELAXATION LAYER | FILM THICKNESS OF THERMAL RELAXATION LAYER | HEAT CAPACITY OF THERMAL RELAXATION LAYER PER UNIT AREA [J/(k*m$^2$)] | HEAT CAPACITY OF TOTAL OF REFLECTION LAYER AND THERMAL RELAXATION LAYER PER UNIT AREA [J/(k*m$^2$)] |
|---|---|---|---|
| Si MONOLAYER FILM | Si 400nm | 0.67 | 1.22 |
| Ta MONOLAYER FILM | Ta 400nm | 0.92 | 1.47 |
| Mo/Si MULTILAYER FILM | Si 4.1nm, Mo 2.8nm, 280 nm OF TOTAL 40 PAIRS | 0.55 | 1.10 |
| Mo/Si MULTILAYER FILM | Si 10nm, Mo 10nm, 400 nm OF TOTAL 20 PAIRS | 0.85 | 1.40 |

REFLECTIVE ORIGINAL, EXPOSURE METHOD, AND DEVICE MANUFACTURING METHOD

BACKGROUND OF THE INVENTION

1. Field of the Invention

The present invention relates to a reflective original, exposure method, and device manufacturing method.

2. Description of the Related Art

At present, the manufacture of semiconductor devices such as a DRAM and MPU has been studied and developed to implement devices having a line width of 22 nm or less in design rule. An exposure apparatus using extreme ultraviolet light (EUV) is prominent as an exposure apparatus used in this generation. An exposure apparatus generally irradiates, with light, a mask (also called an original or reticle) on which a circuit pattern is drawn. The exposure apparatus then reduces the image of the circuit pattern to, for example, ¼ by using a projection optical system, and projection-exposes the reduced image to a wafer coated with a photosensitive agent (resist). In actual exposure, if a particle is attached to the circuit pattern surface of a mask, the image of the particle is transferred at identical positions in respective shots. This decreases the semiconductor device manufacturing yield.

To solve this problem, a transparent protection film called a pellicle is added to a mask in a conventional exposure apparatus having, as a light source, a g-ray, i-ray, KrF laser, ArF laser, or the like. The circuit pattern is protected from a particle by arranging the pellicle at an interval of only several mm from the circuit pattern surface. A particle attached to the pellicle is defocused from the object plane serving as the circuit pattern surface. In general, therefore, a particle is not transferred as an image on a wafer as long as it is a predetermined size or smaller.

However, in an EUV exposure apparatus to which the present invention is applied, there is no practical pellicle for EUV light. To satisfy a requested transmittance, the thickness of the pellicle needs to be about several ten nm. However, with this pellicle thickness, the pellicle cannot be configured at a satisfactory strength in both the mechanical aspect upon a change between the atmospheric pressure and the ambient pressure in a vacuum environment when a mask is transferred, and the thermal aspect when EUV light is absorbed and the temperature rises.

In the EUV exposure apparatus, the mask inevitably becomes pellicle-less. If a particle is generated in the exposure apparatus, it may be attached to the circuit pattern surface of the mask. For example, a case in which a device with a 22-nm design rule is manufactured will be examined. If a 0.1-μm particle is attached to the circuit pattern of a mask and the reduction magnification of the projection optical system is 4:1, the particle image becomes 25 nm on a wafer. Hence, no device can be manufactured. In practice, the size of a particle to be managed is smaller and is equal to or smaller than several ten nm.

The cause of generation and behavior of a particle of a nanometer size generated in a vacuum apparatus have not been fully clarified. However, a particle generated by sliding or friction in the operation of a reticle stage, robot hand, or gate valve, or the like, debris slightly flying from the light source side, and the like are conceivable as generation causes. A reticle is loaded and unloaded via a load lock chamber. When the inside of the load lock chamber is evacuated or released to the air, a particle is generated. Thus, the management of a particle on an EUV mask is a critical issue. To solve this, mask cleaning and particle inspection are essential.

As an EUV mask cleaning method, various methods such as wet cleaning and dry cleaning are proposed. In most cases, a particle is physically attached inside the EUV exposure apparatus, as described above. The dry cleaning method is also effective, so US Patent Application Publication No. 2006/0072085 has proposed cleaning using a laser shock wave, and Japanese Patent Laid-Open No. 2000-088999 has proposed dry laser cleaning.

In EUV mask inspection, to inspect a particle of several ten nm or less, the wavelength of the light source of the inspection apparatus is becoming shorter and its output is becoming larger. For example, 488 nm is used as the light source wavelength. Recently, laser light sources having wavelengths of 266 nm, 248 nm, and 193 nm are being used. Inspection apparatuses using these light sources detect a particle by performing die to die inspection (comparing images of adjacent dies) which has widely been used in conventional mask inspection. Alternatively, the inspection apparatuses detect a particle by performing die to database inspection (comparison inspection of an image with design data), and use the detection result for management of a particle on an EUV mask.

US Patent Application Publication No. 2006/0072085 has proposed a cleaning apparatus which condenses a laser beam in a space near a cleaning target surface to generate a shock wave, and a particle on the surface is removed by the pressure wave. This apparatus is a dry cleaning apparatus and is applicable in situ inside a semiconductor exposure apparatus. Generally, shock wave cleaning often uses a Q-switched Nd:YAG laser as the light source. The YAG laser is a pulse laser having a wavelength of 1,064 nm, a pulse width of about 10 ns, and energy of several hundred mJ or more per pulse. The optical axis is arranged parallel to a cleaning target surface, and a laser beam is condensed to generate a shock wave. To efficiently remove a particle, the distance between the laser spot position and the surface is about several mm. On the surface immediately below a laser condensing unit, thermal damage may be generated by high energy of the pulse laser.

Japanese Patent Laid-Open No. 2000-088999 has disclosed a technique of removing, by a laser beam, a contaminant on the surface of a reflection optical element arranged in an exposure apparatus. The technique in Japanese Patent Laid-Open No. 2000-088999 is general laser cleaning. A cleaning target surface is cleaned by a thermal action of directly irradiating the cleaning target surface with a laser beam of a short wavelength (for example, 248 nm) to excite thermal vibrations of the surface and a particle, or a photochemical action of directly breaking chemical bonds of a contaminant. Japanese Patent Laid-Open No. 2000-088999 has disclosed an example in which an EUV optical element having a multilayer film structure is cleaned by laser cleaning. In this case, the number of layers of the multilayer film is increased, and even removal of the top of the multilayer film by the laser does not influence the EUV reflectance. However, when this technique is applied to an EUV mask, a removed multilayer film is attached again as a foreign substance (particle) to the mask surface.

Similarly, thermal damage may occur even during particle inspection of an EUV mask. This is because the foreign substance detection sensitivity of the inspection apparatus needs to be increased as the size of a foreign substance decreases. In general, the amount of light scattered from a foreign substance upon irradiation with light is inversely proportional to the fourth power of the wavelength and proportional to energy. To increase the detection sensitivity, it is necessary to shorten the wavelength of the light source and increase the energy of the incident light. In this case, the multilayer film greatly absorbs a laser beam to raise the temperature and decrease the reflectance of EUV light.

In this manner, the surface may be damaged by heat in both the EUV mask cleaning and inspection methods. The surface of an EUV mask has a multilayer film, and this structure is sensitive to damage in cleaning and inspection. Therefore, the structure of the multilayer film is desirably durable to heat.

SUMMARY OF THE INVENTION

The present invention provides a reflective original in which generation of damage is reduced even upon application of a thermal load.

The present invention in its one aspect provide a reflective original comprising: a reflection layer which has a multilayer film configured to reflect extreme ultraviolet light; a base material configured to support the reflection layer; and a thermal diffusion layer interposed between the reflection layer and the base material, and configured to diffuse heat of the reflection layer, wherein a heat capacity, per unit area, of a structure constituted by both the reflection layer and the thermal diffusion layer is not lower than 1.1 $(J/(K \cdot m^2))$.

Further features of the present invention will become apparent from the following description of exemplary embodiments with reference to the attached drawings.

BRIEF DESCRIPTION OF THE DRAWINGS

FIG. 3 shows the physical property values of typical materials used in the reflective original;

FIG. 13 shows the heat capacity of a thermal diffusion layer per unit area.

DESCRIPTION OF THE EMBODIMENTS

[EUV Exposure Apparatus]

Figure 2:
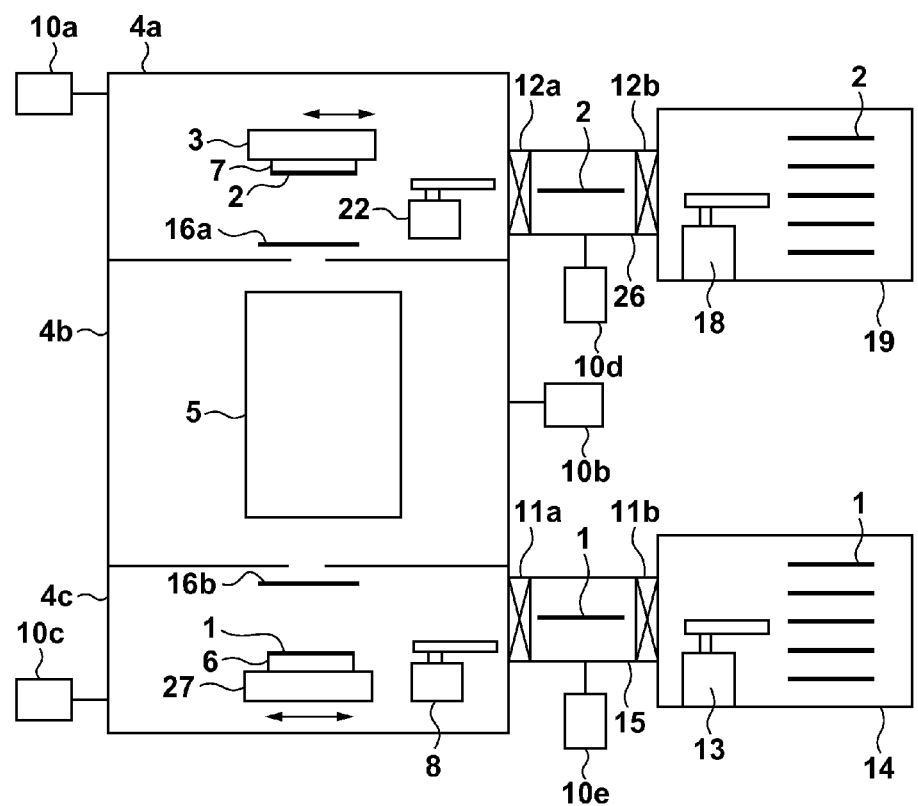
FIG. 2 shows an exposure apparatus in which the reflective original is used.

An EUV exposure apparatus which exposes a substrate by using extreme ultraviolet light (EUV light), to which the present invention is applied, will be explained with reference to FIG. 2. In FIG. 2, an electronic circuit pattern is formed on a reflective reticle (reflective original) 2. In the description of the present invention, a mask and reticle are synonymous. Especially when attention is paid to a pattern or multilayer film, the expression "mask" is used. When attention is paid to a substrate, the expression "reticle" is used.

A reticle chuck 7 holds and fixes the reticle 2. When performing EUV exposure processing, a reticle stage 3 moves the reticle 2 coarsely or finely in the scanning direction. A projection optical system 5 projection-exposes a wafer (substrate) 1 with EUV light reflected by the mask 2. A wafer chuck 6 holds and fixes the wafer 1. A wafer stage 27 moves the wafer 1 so that the wafer 1 can be moved coarsely and finely along six axes. The x and y positions of the wafer stage 27 are always monitored by a laser interferometer (not shown). Let $(1/\beta)$ be the reduction magnification of the projection optical system 5, Vr be the scanning speed of the reticle stage 3, and Vw be the scanning speed of the wafer stage 27. Then, the reticle stage 3 and wafer stage 27 are controlled to be synchronized with each other to establish a relation of $Vr/Vw=\beta$. Since exposure processing is performed in a vacuum environment, the reticle stage 3 is housed in a reticle stage space 4a, the projection optical system 5 is housed in a projection optical system space 4b, and the wafer stage 27 is housed in a wafer stage space 4c. The respective spaces 4a to 4c can be spatially partitioned by gate valves 16a and 16b. Vacuum systems 10a, 10b, and 10c are independently arranged for the respective spaces 4a, 4b, and 4c, and can independently control the pressure.

A transfer hand 8 loads and unloads the wafer 1 between a wafer load lock chamber 15 and the wafer stage 27. A vacuum system 10e evacuates the wafer load lock chamber 15. A gate valve 11a is arranged on the exposure apparatus side in the wafer load lock chamber 15, and a gate valve 11b is arranged on the side of a wafer exchange chamber 14. The wafer exchange chamber 14 temporarily stores the wafer 1 at the atmospheric pressure. A transfer hand 13 loads and unloads the wafer 1 between the wafer exchange chamber 14 and the wafer load lock chamber 15. A transfer hand 22 loads and unloads the reticle 2 between a reticle load lock chamber 26 and the reticle stage 3. A vacuum system 10d evacuates the reticle load lock chamber 26. A gate valve 12a is arranged on the exposure apparatus side in the reticle load lock chamber 26, and a gate valve 12b is arranged on the side of a reticle exchange chamber 19. The reticle exchange chamber 19 temporarily stores the reticle 2 at the atmospheric pressure. A transfer hand 18 loads and unloads the reticle 2 between the reticle load lock chamber 26 and the reticle exchange chamber 19.

[Mask]

In general, the film structure of an EUV mask is constituted by a multilayer film (to be referred to as a reflection layer hereinafter) which reflects EUV light, a capping layer (protection layer) which protects the surface of the reflection layer from oxidization and contamination, and a Ta- or Cr-based absorption layer which absorbs EUV light. An EUV mirror constituting the projection optical system 5 does not include an absorption layer, but is constituted by a reflection layer and capping layer, similar to the EUV mask. In the description of the embodiment, the film structure of the EUV mask includes a reflection layer which reflects EUV, and a capping layer for it, as described above.

The present inventor estimated the temperature rise of the film structure in laser cleaning of the EUV mask when considering thermal damage to the film structure of the EUV mask. An ArF excimer laser was assumed as a pulse laser used for laser cleaning. For irradiation conditions, laser irradiation conditions in an experiment in which laser cleaning was applied to an EUV mask, to which a test particle having a particle size of several ten nm was attached, and a removal rate of 99% or higher was achieved were assumed.

Figure 4:
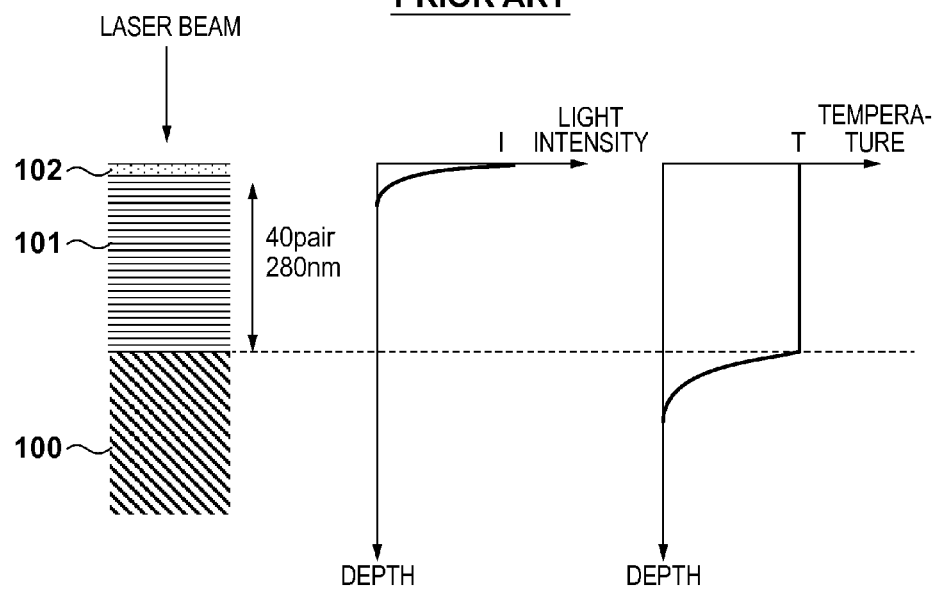
FIG. 4 shows the film arrangement of a conventional reflective original, and the intensity distribution and temperature distribution upon laser irradiation.

FIG. 4 shows the film structure of a conventional EUV mask. A 280-nm thick reflection layer 101 obtained by alternately stacking a plurality of Mo layers and a plurality of Si layers by 40 pairs is formed on a base material 100 made of an ultra-low expansion glass or $SiO_2$. A 2.5-nm thick Ru capping layer 102 is formed on the top layer. The base material 100 supports the reflection layer 101. FIG. 3 shows the thermophysical property values of respective materials constituting the EUV mask. When one pulse of an ArF laser beam enters the EUV mask, the light intensity I calculated from the absorption coefficients of the respective substances constituting the film structure reveals that light reaches only several upper layers of the reflection layer 101, as shown in FIG. 4. Heat generated by the absorption of the laser beam conducts inside the reflection layer 101, obtaining the distribution of the temperature T.

Figure 6:
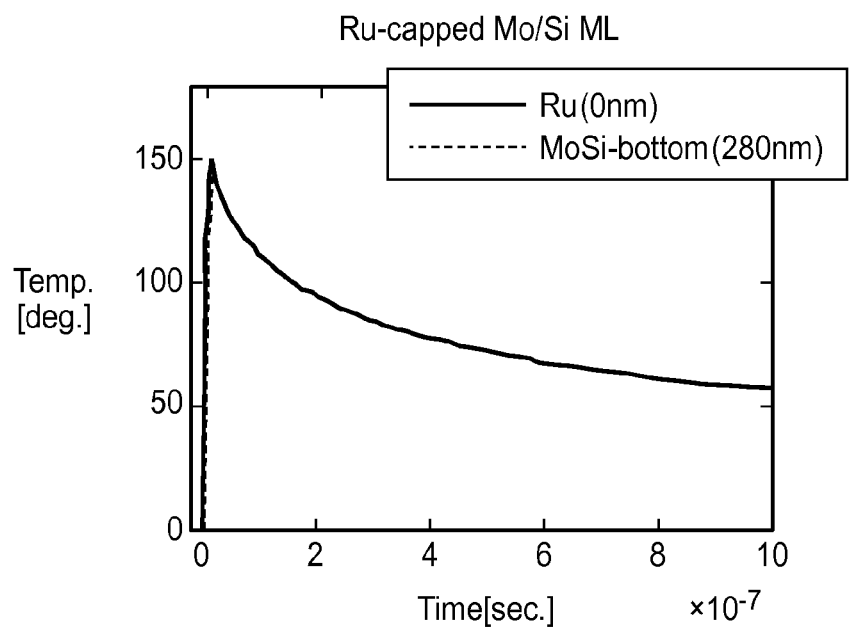
FIG. 6 shows a temperature change upon laser irradiation of a multilayer film.
Figure 7:
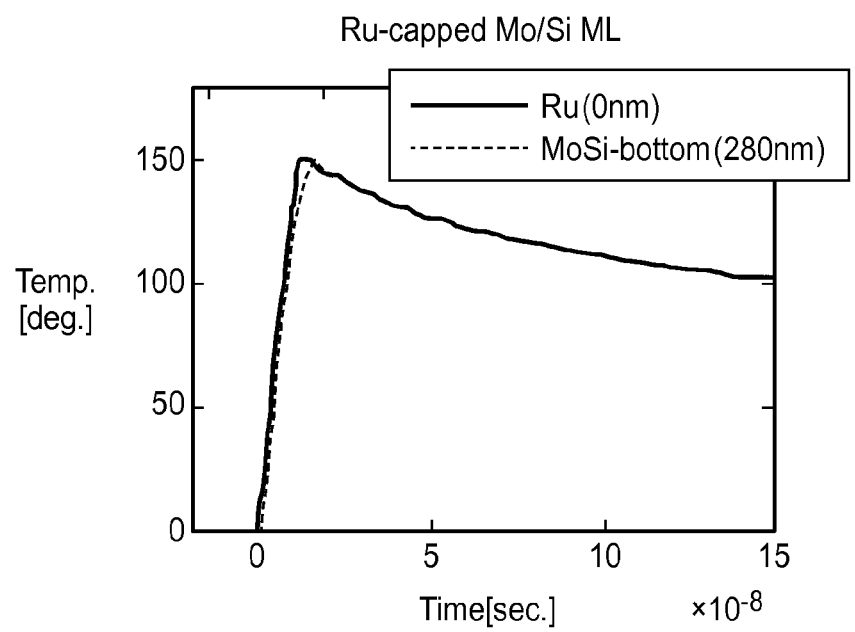
FIG. 7 is an enlarged view of the time axis of FIG. 6.

FIGS. 6 and 7 show the results of calculating this phenomenon as transient heat conduction calculation. In FIGS. 6 and 7, the horizontal axis represents the time (sec), and the vertical axis represents the rising temperature (C.°). FIG. 7 is an enlarged view of the horizontal axis in FIG. 6. In FIGS. 6 and 7, a solid line indicates a temperature change of the Ru film, and a dotted line indicates a temperature change of the reflection layer 101 at 280 nm from the bottom of the reflection layer 101, that is, near the base material 100. As is apparent from FIGS. 6 and 7, the ArF laser beam passes through only the upper layer of the reflection layer 101, but the temperature changes at almost the same time constant in even the Ru film and the lower portion of the reflection layer 101. That is, no large temperature distribution is generated inside the capping layer 102 and reflection layer 101. The temperature distribution becomes almost flat inside the capping layer 102 and reflection layer 101, as represented by the temperature T in FIG. 4.

Referring to FIGS. 6 and 7, a temperature rise of about 150° C. is generated by one pulse in both the Ru film and the reflection layer 101. Japanese Patent Laid-Open No. 2002-277589 has described an experimental fact that, when a reflection layer is heated to around 200° C., the reflectance starts decreasing. A conceivable reason of this is thermal diffusion at the interface between the Mo layer and Si layer constituting the reflection layer 101. Hence, the above-mentioned laser irradiation conditions can be regarded as threshold conditions for cleaning an EUV mask and maintaining a desired reflectance of the reflection layer 101.

Figure 5:
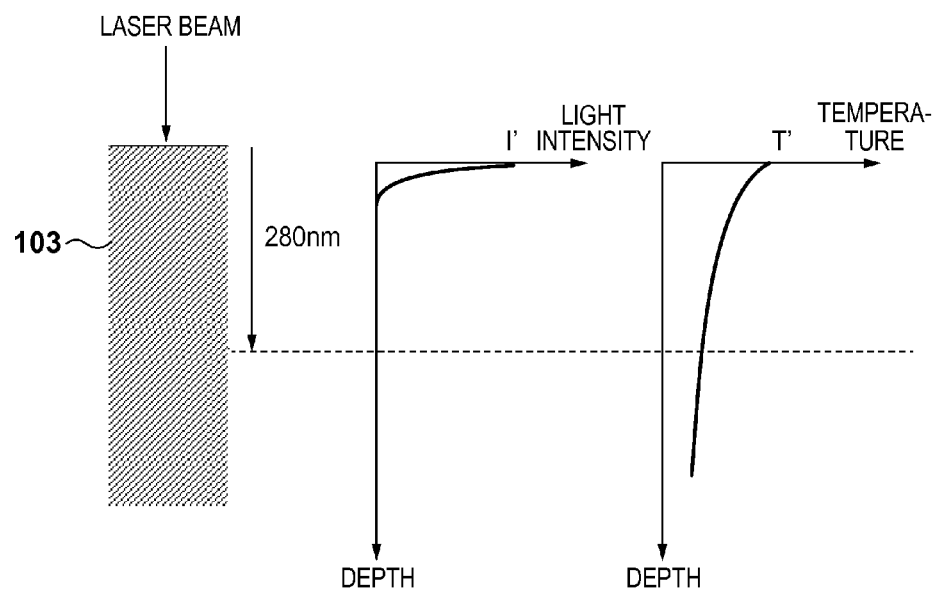
FIG. 5 shows the intensity distribution and temperature distribution upon laser irradiation of a multilayer film.

For comparison with this, even a temperature rise inside an Si substrate 103 was examined under the same laser irradiation conditions. When one pulse of an ArF laser beam enters the Si substrate 103, the light intensity I' is calculated from the absorption coefficient of Si, as shown in FIG. 5. By absorption of the laser beam, heat generated near the surface of the Si substrate 103 conducts toward the bottom of the Si substrate 103.

Figure 8:
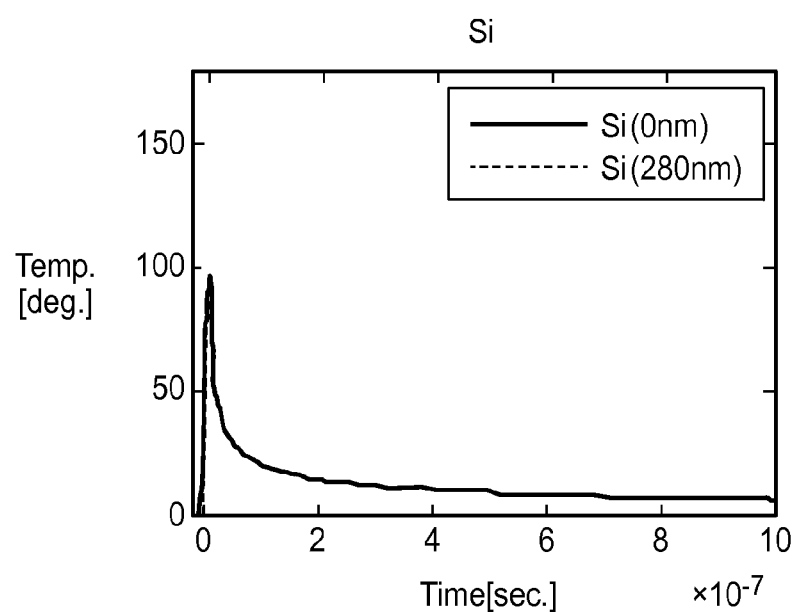
FIG. 8 shows a temperature change upon laser irradiation of an Si substrate.
Figure 9:
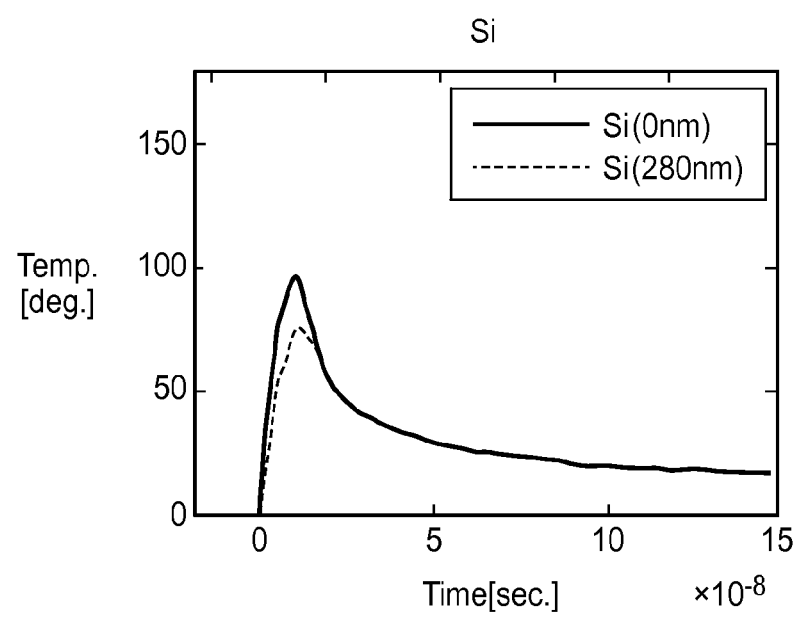
FIG. 9 is an enlarged view of the time axis of FIG. 8.

FIGS. 8 and 9 show the results of calculating this phenomenon as transient heat conduction calculation. In FIGS. 8 and 9, the horizontal axis represents the time (sec), and the vertical axis represents the rising temperature (C.°). FIG. 9 is an enlarged view of the horizontal axis in FIG. 8. In FIGS. 8 and 9, a solid line indicates a temperature change of the surface of the Si substrate 103, and a dotted line indicates a temperature change at a position of 280 nm from the surface of the Si substrate 103. As is apparent from FIGS. 8 and 9, the temperature rise on the surface of the Si substrate 103 is about 100° C., which is much lower than the temperature of 150° C. on the Ru surface. An internal temperature at a depth of 280 nm from the surface of the Si substrate 103 is about 70° C., and a temperature gradient is generated between the surface and the inside. Thus, the Si substrate 103 exhibits a temperature distribution in which the temperature is high on the surface and decreases toward the bottom, as represented by the temperature T' in FIG. 5.

The difference in temperature distribution between the capping layer 102 and reflection layer 101, and the Si substrate 103 can be explained as follows. A thermal diffusivity $\alpha$ [m$^2$/s] in the table of the thermophysical properties of the substances constituting the EUV mask in FIG. 3 is defined by:

$$\alpha = \lambda/(\rho c) \tag{1}$$

where $\rho$ is the density (kg/m$^3$), $c$ is the specific heat (J/(kg·K)), and $\lambda$ is the thermal conductivity (W/(m·K)).

The thermal diffusivity $\alpha$ is the thermal conductivity per heat capacity, and is an amount representing the ease of conduction of the temperature. To pay attention to this amount, the thermal diffusivity of the ultra-low expansion glass or SiO$_2$ constituting the base material 100 is defined as 1. At this time, the thermal diffusivity ratios of respective substances constituting the capping layer 102 and reflection layer 101 are higher by several ten times. In this manner, the capping layer 102 and reflection layer 101 have high thermal diffusivity, compared to the ultra-low expansion glass or SiO$_2$ constituting the base material 100. That is, when a laser beam enters the capping layer 102, the temperature inside the reflection layer 101 rises instantaneously and heat diffuses quickly. However, the thermal diffusivity of the base material 100 is much lower than that of the film, so a large temperature gap is generated at the interface between the reflection layer 101 and the base material 100, as represented by the temperature distribution T in FIG. 4. Thus, the reflection layer 101 can be regarded as an isolated thermal conductive material on the base material 100.

In contrast, when a laser beam enters the Si substrate 103, heat is generated near the surface and instantaneously conducts inside. At this time, an interface at which a temperature gap is generated does not exist inside. For this reason, the temperature decreases toward the bottom of the Si substrate 103. The temperature does not rise so much as in the reflection layer 101. On the Si substrate 103, a temperature gradient is generated between the surface and the inside.

As described above, the reflection layer 101 of the EUV mask can be regarded as an isolated thermal conductive material. A temperature rise $\Delta T$ during a time $\Delta t$ upon incidence of energy Q is approximated by:

$$\Delta T = (Q/\rho c V) \cdot \Delta t \tag{2}$$

where V is the volume (m$^3$) of the reflection layer 101.

Equation (2) represents that, even if the input energy Q by the laser is large, the temperature rise $\Delta T$ upon irradiation by the laser can be suppressed to be low by increasing $\rho c V$. The theoretical background of the present invention has been explained above. As described above, if the design rule of semiconductor devices advances from 22 nm to 16 nm in the future, the size of a particle to be managed on the mask decreases proportionally to be 0.7 times. Generally, it is considered that a particle attached to the surface detaches from the surface when the inertial force acting on the particle becomes larger than the attaching force.

Letting d be the size of a particle, the inertial force is proportional to d$^3$, and the attaching force is proportional to d. That is, the acceleration necessary for detachment is proportional to 1/d$^2$. If the size of a particle to be managed becomes 0.7 times, the requested acceleration is substantially doubled. At this time, even the irradiation energy Q of the laser needs to be about twice as large as the current irradiation energy. In this case, it is predicted from the aforementioned simulation result that the temperature of the reflection layer rises by one pulse to about 300° C., which is twice as high as the current temperature of 150° C. If the reflection layer is heated to around 200° C., the reflectance starts decreasing. Under this laser irradiation condition, it is predicted that the current reflection layer is damaged.

Figure 1:
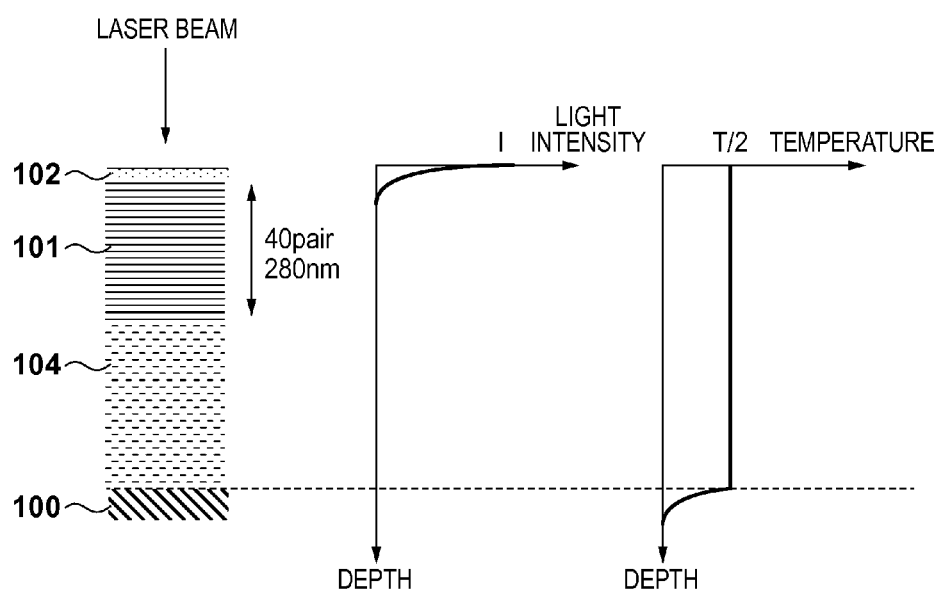
FIG. 1 shows the film arrangement of a reflective original.

The present invention aims to avoid damage to the reflection layer that may occur when the design rule advances from 22 nm to 16 nm in the future. The conventional structure of the reflection layer of the EUV mask was constituted by a total of 40 pairs (280 nm thick) each of an Mo layer and Si layer, as shown in FIG. 4. These 40 pairs are necessary to obtain a target reflectance with respect to EUV light. To the contrary, in the embodiment, a thermal diffusion layer 104 is newly inserted between the reflection layer 101 and the base material 100 made of the ultra-low expansion glass or $SiO_2$, as shown in FIG. 1. Also, in the embodiment, the capping layer (protection layer) 102 is arranged on the reflection layer 101 on a side opposite to the thermal diffusion layer 104, as shown in FIG. 1. The thermal diffusion layer 104 is formed from, for example, a film having a heat capacity equal to or higher than that of the reflection layer 101 per unit area, and having a thermal diffusivity equal to or higher than that of the reflection layer 101. In the embodiment, this is equivalent to a case in which V of ρcV in equation (2) becomes twice or more, that is, the number of layers of a multilayer film becomes twice or more in a structure constituted by the reflection layer 101 and thermal diffusion layer 104. Accordingly, even if micropatterning proceeds and the irradiation energy of a laser is doubled, the temperature rise can be kept at 150° C. or less, and the reflectance of EUV light in the reflection layer does not decrease.

The heat capacity, per unit area, of the Mo/Si multilayer films of the 40 pairs constituting the reflection layer 101 is calculated by using FIG. 3. When the heat capacity is calculated in consideration of the Mo thickness of 2.8 nm and the Si thickness of 4.1 nm, the heat capacity of the Mo/Si multilayer film per unit area is 0.55 $(J/(K \cdot m^2))$. In the embodiment, by inserting the thermal diffusion layer 104, the heat capacity of the structure constituted by the reflection layer 101 and thermal diffusion layer 104 becomes twice or more to be 1.1 $(J/(K \cdot m^2))$. At this time, the temperature rise inside the reflection layer 101 becomes T/2 or less, as shown in FIG. 1, and the temperature rise is relaxed.

Figure 10:
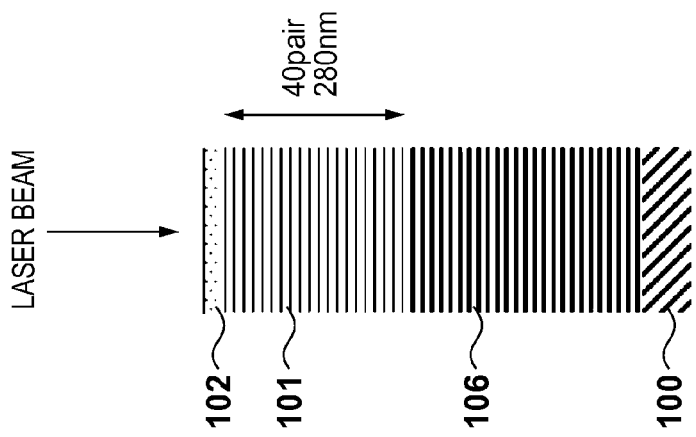
FIG. 10 shows another example of the reflective original.

In the embodiment, the heat capacity of the Mo/Si multilayer films of the 40 pairs that satisfies a desired reflectance with respect to EUV light is used as a standard. The heat capacity, per unit area, of all films stacked on the base material of a reflective mask is set to be twice or more than the current heat capacity. For example, as the film material of the thermal diffusion layer 104, an Si monolayer film 105 may be inserted as the thermal diffusion layer, as shown in FIG. 10. As is also apparent from FIG. 3, Si can be used as material of the thermal diffusion layer because both ρc and λ are high. For example, for a 400-nm thick Si monolayer film, the heat capacity of the thermal diffusion layer per unit area is 0.67 $(J/(K \cdot m^2))$, as shown in FIG. 13. The total heat capacity per unit area, including the reflection layer 101, is 1.22 $(J/(K \cdot m^2))$. Since Si is a material constituting the Mo/Si multilayer film, it does not have any problem as a deposition material. By inserting the thermal diffusion layer 104 between the reflection layer 101 and the base material 100, the total heat capacity of the films of the mask can be increased to suppress the temperature rise.

As another example of the thermal diffusion layer 104, a material which has been frequently used as a mask film material, such as Ta or Cr, is also usable, though it is not shown. For example, for a 400-nm thick Ta monolayer film, the heat capacity of the thermal diffusion layer 104 per unit area is 0.92 $(J/(K \cdot m^2))$, as shown in FIG. 13. The total heat capacity per unit area, including the reflection layer 101, is 1.47 $(J/(K \cdot m^2))$.

Figure 11:
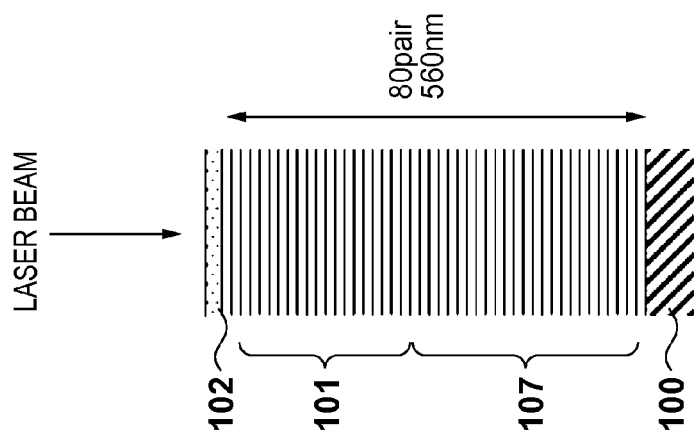
FIG. 11 shows still another example of the reflective original.

When a monolayer film is used as the above-described thermal diffusion layer 104, a problem that it is difficult to ensure the film flatness in deposition may arise. In this case, undulations may be generated in a film structure formed on the base material 100, and the phase of reflected light of EUV light may shift. To cope with this, the thermal diffusion layer 104 can be formed from a multilayer film having a periodical structure, as shown in FIG. 11. In FIG. 11, a multilayer film 107 having the same film structure as that of the reflection layer 101 is used as a thermal diffusion layer below the reflection layer 101. For example, 40 pairs (560 nm) of Mo/Si multilayer films are added as the thermal diffusion layer. In this case, the heat capacity of the thermal diffusion layer per unit area is 0.55 $(J/(K \cdot m^2))$. The total heat capacity per unit area, including the reflection layer, is 1.10 $(J/(K \cdot m^2))$. It is not so difficult for the EUV mask manufacturing method to increase the number of layers of a multilayer film formed on the base material 100. In this case, V of ρcV is simply doubled, and it is predicted that the temperature rise inside the reflection layer becomes T/2, as shown in FIG. 1. Although this example has assumed that the thermal diffusion layer is formed from 40 pairs, the number of pairs is not limited to 40, as a matter of course. If possible, 100 pairs or more can be deposited. It is considered that the temperature rise is further relaxed.

Figure 12:
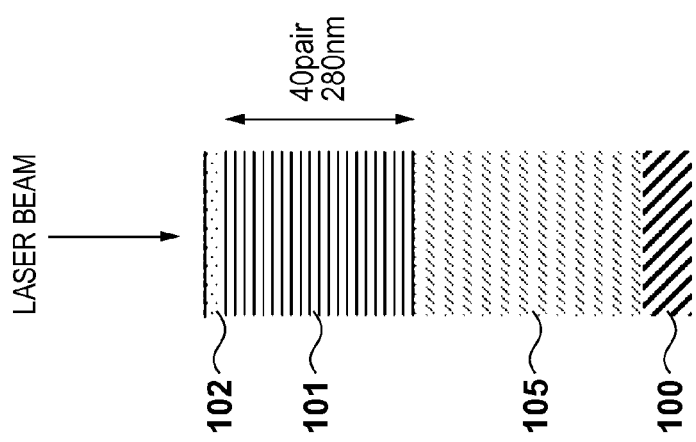
FIG. 12 shows still another example of the reflective original.

Another example of the thermal diffusion layer 104 will be explained with reference to FIG. 12. In the above description, the film thicknesses of Mo and Si constituting the thermal diffusion layer are equal to those of Mo (2.8 nm) and Si (4.1 nm) constituting the upper reflection layer 101. However, the thermal diffusion layer 104 suffices to have a structure acting on only thermal diffusion, so the film thicknesses are not limited to them. For example, it is also possible to change the respective film thicknesses to thicknesses easy to deposit, such as Si=10 nm and Mo=10 nm, and stack the films while ensuring the film flatness. For example, when a relaxation layer constituted by 20 pairs having such film thicknesses is considered, the heat capacity of the thermal diffusion layer per unit area is 0.85 $(J/(K \cdot m^2))$, as shown in FIG. 13. The total heat capacity per unit area, including the reflection layer, is 1.40 $(J/(K \cdot m^2))$.

The present invention has a characteristic in which the thermal diffusion layer is formed from a film material of a conventional mask or a combination of film materials of a conventional mask, and the heat capacity, per unit area, of a structure constituted by a reflection layer and thermal diffusion layer contributing to reflection of EUV light is set to be 1.1 $(J/(K \cdot m^2))$ or more, which is twice or more than the conventional heat capacity.

In the above description, the temperature rise inside the reflection layer that occurs when laser cleaning is applied is aimed to be reduced. As other processes in which the reflectance may decrease owing to the temperature rise of the EUV mask, pattern inspection of the mask, correction of the mask, the EUV exposure operation, and the like are conceivable. However, the temperature rise can be similarly suppressed even in other processes as long as the peak temperature inside the reflection layer can be suppressed in laser cleaning having a largest thermal load. The embodiment has explained the present invention by exemplifying the film structure of the EUV mask. As described above, the present invention is also established similarly even for an EUV mirror constituting a projection optical system in an EUV exposure apparatus, as a matter of course.

[Device Manufacturing Method]

A device manufacturing method of manufacturing a device (for example, a semiconductor device or liquid crystal display device) by using an exposure apparatus including the above-described reflective mask will be explained. The semiconductor device is manufactured through a pre-process of forming an integrated circuit on a wafer, and a post-process of completing, as a product, an integrated circuit chip on the wafer that has been formed in the pre-process. The pre-process includes a step of exposing a wafer coated with a photosensitive agent by using the above-mentioned exposure apparatus, and a step of developing the wafer. The post-process includes an assembly step (dicing and bonding) and a packaging step (encapsulation). The liquid crystal display device is manufactured through a process of forming a transparent electrode. The process of forming a transparent electrode includes a step of applying a photosensitive agent to a glass substrate on which a transparent conductive film is deposited, a step of exposing the glass substrate coated with the photosensitive agent by using the above-described exposure apparatus, and a step of developing the glass substrate. According to the device manufacturing method of the embodiment, a higher quality device than a conventional one can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-144855, filed Jul. 10, 2013, which is hereby incorporated by reference herein in its entirety.

What is claimed is:

1. A reflective original comprising:
a reflection layer which has a multilayer film configured to reflect extreme ultraviolet light;
a base material configured to support said reflection layer; and
a thermal diffusion layer interposed between said reflection layer and said base material, and configured to diffuse heat of said reflection layer,
wherein a heat capacity, per unit area, of a structure constituted by both said reflection layer and said thermal diffusion layer is not lower than 1.1 $(J/(K \cdot m^2))$.

2. The original according to claim 1, wherein a heat capacity of said thermal diffusion layer is not lower than a heat capacity of said reflection layer.

3. The original according to claim 1, wherein a thermal diffusivity of said thermal diffusion layer is not lower than a thermal diffusivity of said reflection layer.

4. The original according to claim 1, wherein said reflection layer is formed from a multilayer film obtained by alternately stacking a plurality of Mo layers and a plurality of Si layers.

5. The original according to claim 1, wherein said thermal diffusion layer is formed from a monolayer film.

6. The original according to claim 5, wherein the monolayer film is formed from a material selected from the group consisting of Si, Ta, and Cr.

7. The original according to claim 1, wherein said thermal diffusion layer is formed from a multilayer film.

8. The original according to claim 7, wherein said thermal diffusion layer is formed from a multilayer film obtained by alternately stacking a plurality of Mo layers and a plurality of Si layers.

9. The original according to claim 4, wherein
said thermal diffusion layer is formed from a multilayer film obtained by alternately stacking a plurality of Mo layers and a plurality of Si layers, and
a thickness of one Mo layer and a thickness of one Si layer constituting said thermal diffusion layer are different from a thickness of one Mo layer and a thickness of one Si layer constituting said reflection layer.

10. The original according to claim 1, further comprising a protection layer configured to protect said reflection layer on a side of said reflection layer opposite to said thermal diffusion layer.

11. A method of irradiating a reflective original with extreme ultraviolet light and exposing a substrate by using the extreme ultraviolet light reflected by the reflective original, wherein the reflective original includes:
a reflection layer which has a multilayer film configured to reflect extreme ultraviolet light;
a base material configured to support the reflection layer; and
a thermal diffusion layer interposed between the reflection layer and the base material, and configured to diffuse heat of the reflection layer, and
a heat capacity, per unit area, of a structure constituted by both the reflection layer and the thermal diffusion layer is not lower than 1.1 $(J/(K \cdot m^2))$.

12. A method of manufacturing a device, comprising:
irradiating a reflective original with extreme ultraviolet light and exposing a substrate by using the extreme ultraviolet light reflected by the reflective original;
developing the exposed substrate; and
processing the developed substrate to manufacture the device,
wherein the reflective original includes:
a reflection layer which has a multilayer film configured to reflect extreme ultraviolet light;
a base material configured to support the reflection layer; and
a thermal diffusion layer interposed between the reflection layer and the base material, and configured to diffuse heat of the reflection layer, and
a heat capacity, per unit area, of a structure constituted by both the reflection layer and the thermal diffusion layer is not lower than 1.1 $(J/(K \cdot m^2))$.

13. A reflective original comprising:
a reflection layer which has a multilayer film configured to reflect extreme ultraviolet light;
a base material configured to support said reflection layer; and
a thermal diffusion layer interposed between said reflection layer and said base material, and configured to diffuse heat of said reflection layer,
wherein a heat capacity of said thermal diffusion layer is not lower than a heat capacity of said reflection layer.

14. The original according to claim 13, wherein a thermal diffusivity of said thermal diffusion layer is not lower than a thermal diffusivity of said base material.

* * * * *